United States Patent
Kadono

(10) Patent No.: US 9,117,676 B2
(45) Date of Patent: Aug. 25, 2015

(54) METHOD OF PRODUCING EPITAXIAL SILICON WAFER, EPITAXIAL SILICON WAFER, AND METHOD OF PRODUCING SOLID-STATE IMAGE SENSING DEVICE

(71) Applicant: SUMCO Corporation, Minato-ku, Tokyo (JP)

(72) Inventor: Takeshi Kadono, Minato-ku (JP)

(73) Assignee: SUMCO Corporation, Tokyo (JP)

( * ) Notice: Subject to any disclaimer, the term of this patent is extended or adjusted under 35 U.S.C. 154(b) by 0 days.

(21) Appl. No.: 14/078,286

(22) Filed: Nov. 12, 2013

(65) Prior Publication Data

US 2014/0134780 A1 May 15, 2014

(30) Foreign Application Priority Data

Nov. 13, 2012 (JP) .................. 2012-249244

(51) Int. Cl.
*H01L 21/02* (2006.01)
*H01L 27/146* (2006.01)

(52) U.S. Cl.
CPC ...... *H01L 21/02658* (2013.01); *H01L 21/0262* (2013.01); *H01L 21/02381* (2013.01); *H01L 21/02532* (2013.01); *H01L 21/02576* (2013.01); *H01L 21/02631* (2013.01); *H01L 27/14687* (2013.01)

(58) Field of Classification Search
None
See application file for complete search history.

(56) References Cited

U.S. PATENT DOCUMENTS

| 5,416,345 | A * | 5/1995 | Matsunaga .................. 257/222 |
| 5,734,195 | A * | 3/1998 | Takizawa et al. ............ 257/607 |
| 6,284,384 | B1 * | 9/2001 | Wilson et al. ................ 428/450 |
| 7,259,036 | B2 * | 8/2007 | Borland et al. ................ 438/37 |
| 2002/0000189 | A1 * | 1/2002 | Tanaka et al. .................. 117/19 |

FOREIGN PATENT DOCUMENTS

| JP | 6-338507 A | 12/1994 |
| JP | 2008-294245 A | 12/2008 |
| JP | 2010-177233 A | 8/2010 |

* cited by examiner

*Primary Examiner* — Scott B Geyer
(74) *Attorney, Agent, or Firm* — Christensen O'Connor Johnson Kindness PLLC

(57) ABSTRACT

Provided is an epitaxial silicon wafer with reduced metal contamination achieved by higher gettering capability and a method of efficiently producing the same.

The method of producing an epitaxial wafer includes a wafer production step of pulling a single crystal silicon ingot having a COP formation region by Czochralski process, and subjecting the obtained single crystal silicon ingot to slicing, thereby producing a silicon wafer 10 including COPs; a cluster ion irradiation step of irradiating the produced silicon wafer 10 with cluster ions 16 to form a modifying layer 18 formed from a constituent element of the cluster ions 16, contained as a solid solution in a surface portion 10A of the silicon wafer 10; and an epitaxial layer formation step of forming an epitaxial layer 20 on the modifying layer 18 of the silicon wafer 10.

12 Claims, 9 Drawing Sheets

FIG. 7
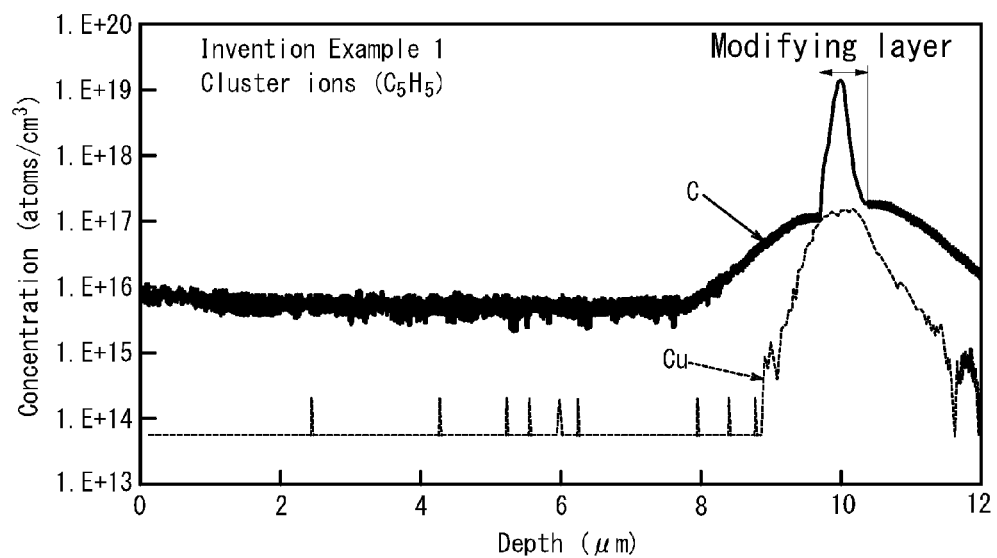
(A)
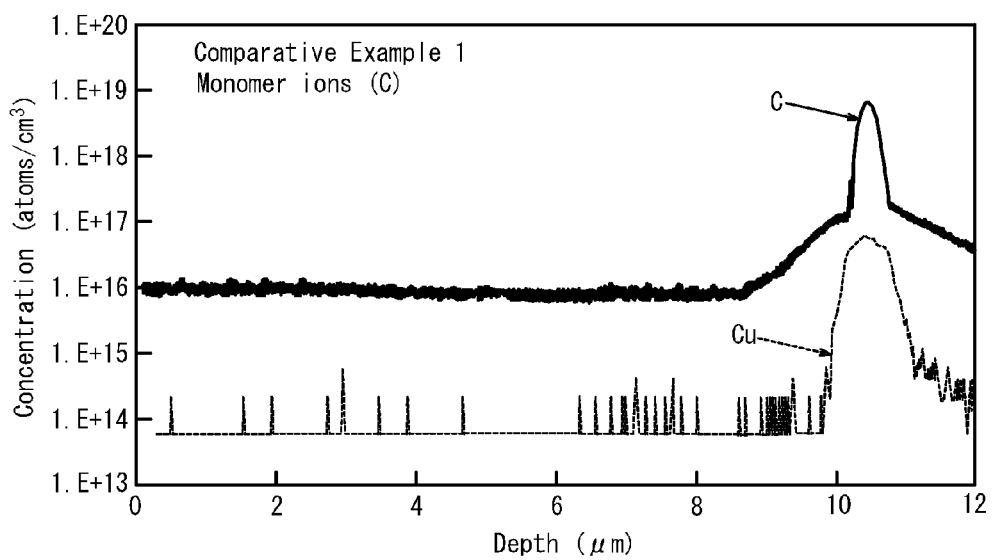
(B)

METHOD OF PRODUCING EPITAXIAL SILICON WAFER, EPITAXIAL SILICON WAFER, AND METHOD OF PRODUCING SOLID-STATE IMAGE SENSING DEVICE

TECHNICAL FIELD

The present invention relates to a method of producing an epitaxial silicon wafer, an epitaxial silicon wafer, and a method of producing a solid-state image sensing device. The present invention relates in particular to a method of efficiently producing an epitaxial silicon wafer, which can achieve higher gettering capability thereby suppressing metal contamination.

BACKGROUND ART

Metal contamination is a major cause of deterioration in characteristics of a semiconductor device. For example, for a back-illuminated solid-state image sensing device, metal mixed into a semiconductor epitaxial wafer to be a substrate of the device causes increased dark current in the solid-state image sensing device, and results in formation of defects referred to as white spot defects. Recently, a back-illuminated image sensing device has been widely used for digital cameras and mobile phones such as smartphones because it can directly receive light from the outside, and take sharper images or motion pictures even in a dark place and the like due to the fact that a wiring layer and the like thereof are disposed at a lower layer than a sensor unit. Therefore, it is desirable to reduce white spot defects as much as possible.

Mixing of metal into a wafer mainly occurs in a process of producing a semiconductor epitaxial wafer and a process of producing a solid-state image sensing device (device fabrication process). Metal contamination in the former process of producing a semiconductor epitaxial wafer may be due to heavy metal particles from components of an epitaxial growth furnace, or heavy metal particles caused by metal corrosion of piping materials of the furnace due to chlorine-based gas used in epitaxial growth in the furnace. In recent years, such metal contaminations have been reduced to some extent by replacing components of epitaxial growth furnaces with highly corrosion resistant materials, but not to a sufficient extent. On the other hand, in the latter process of producing a solid-state image sensing device, heavy metal contamination of semiconductor substrates would occur in process steps such as ion implantation, diffusion, and oxidizing heat treatment in the producing process.

For these reasons, conventionally, heavy metal contamination of semiconductor epitaxial wafers has been avoided by forming, in the semiconductor wafer, a gettering sink for trapping the metal, or using a substrate, such as a high boron concentration substrate, having high ability to trap the metal (gettering capability).

In general, a gettering sink is formed in a semiconductor wafer by an intrinsic gettering (IG) method in which oxygen precipitate s (commonly called a silicon oxide precipitate, and also called BMD: bulk micro defect) or dislocations that are crystal defects are formed within the semiconductor wafer, or an extrinsic gettering (EG) method in which the gettering sink is formed on the rear surface of the semiconductor wafer.

Here, a technique of forming gettering sites in a semiconductor wafer by ion implantation can be given as a technique for gettering heavy metal. JP 06-338507 A (PTL 1) discloses a producing method, by which carbon ions are implanted through a surface of a silicon wafer to form a carbon ion implanted region, and a silicon epitaxial layer is formed on its surface thereby obtaining an epitaxial silicon wafer. In that technique, the carbon ion implanted region functions as gettering sites.

Further, JP 2008-294245 A (PTL 2) discloses a method of forming a carbon implanted layer by implanting carbon ions into a silicon wafer, and then performing heat treatment using a rapid thermal annealing (RTA) apparatus for recovering the crystallinity of the wafer which has been disrupted by the ion implantation, thereby shortening the recovery heat treatment process.

Further, JP 2010-177233 A (PTL 3) discloses a method of producing an epitaxial wafer, comprising the steps of ion-implanting at least one of boron, carbon, aluminum, arsenic, and antimony at a dose in the range of $5\times10^{14}$ atoms/cm$^2$ to $1\times10^{16}$ atoms/cm$^2$ into a single crystal silicon ingot substrate; then cleaning the single crystal silicon ingot substrate subjected to the ion implantation, without recovery heat treatment; and then forming an epitaxial layer at a temperature of 1100° C. or more using a single wafer processing epitaxial apparatus.

CITATION LIST

Patent Literature

PTL 1: JP 06-338507 A
PTL 2: JP 2008-294245 A
PTL 3: JP 2010-177233 A

SUMMARY OF INVENTION

Technical Problem

In the techniques described in PTL 1, PTL 2, and PTL 3, monomer ions (single ions) are implanted into a silicon wafer before forming an epitaxial layer. However, according to studies made by the inventor of the present invention, it was found that white spot defects cannot be sufficiently reduced in solid-state image sensing devices produced using silicon epitaxial wafers subjected to monomer-ion implantation, and such epitaxial silicon wafers are required to achieve stronger gettering capability.

Further, it is important that epitaxial silicon wafers which can achieve such high gettering capability can be produced with high productivity, and there has been a demand for establishing a method of efficiently producing epitaxial silicon wafers which can achieve high gettering capability.

In view of the above problems, an object of the present invention is to provide a method of efficiently producing an epitaxial silicon wafer with reduced metal contamination achieved by higher gettering capability.

Solution to Problem

According to further studies made by the inventor of the present invention, irradiation of a silicon wafer with cluster ions is advantageous in the following points as compared with implantation of monomer ions into the silicon wafer. Specifically, even if irradiation with cluster ions is performed at an acceleration voltage equivalent to the case of monomer ion implantation, the energy per one atom or one molecule applied to the irradiated silicon wafer is advantageously lower than in the case of monomer ion implantation, and irradiation with a plurality of atoms can be performed at a time. This results in higher peak concentration in the depth direction profile of the irradiating element, and allows the peak position to approach the surface of the silicon wafer. Thus, the gettering capability was found to be improved.

The inventor also found that an epitaxial silicon wafer can be efficiently produced by using a silicon wafer including crystal originated particles (COPs) as a substrate of the epitaxial silicon wafer, which allows for growing a single crystal silicon ingot to be the material of the silicon wafer at high pulling speed. Thus, the present invention was completed.

Specifically, a method of producing an epitaxial wafer according to the present invention includes a wafer production step of pulling a single crystal silicon ingot having a COP formation region by Czochralski process, and subjecting the obtained single crystal silicon ingot to slicing, thereby producing a silicon wafer including COPs; a cluster ion irradiation step of irradiating the produced silicon wafer with cluster ions to form a modifying layer formed from a constituent element of the cluster ions in a surface portion of the silicon wafer; and an epitaxial layer formation step of forming an epitaxial layer on the modifying layer of the silicon wafer.

Here, the single crystal silicon ingot is preferably pulled at growing conditions: residence time of the single crystal silicon ingot for 150 min or less in a temperature range of 1200° C. to 1000° C. Further, the pulling of the single crystal silicon ingot can be performed while cooling around the single crystal silicon ingot.

In the present invention, after the cluster ion irradiation step, the silicon wafer can transferred into an epitaxial growth apparatus to be subjected to the epitaxial layer formation step without heat treating the silicon wafer for recovering its crystallinity.

Here, the cluster ions preferably contain carbon as a constituent element. The cluster ions more preferably contain at least two kinds of elements including carbon as constituent elements.

Further, in the cluster ion irradiation step, the silicon wafer can be irradiated with the cluster ions such that the peak of a concentration profile of the constituent element in the depth direction of the modifying layer lies at a depth within 150 nm from the surface of the silicon wafer.

The cluster ion irradiation step is preferably performed under the conditions of acceleration voltage: 50 keV/atom or less, cluster size: 100 or less, and carbon dose: $1 \times 10^{16}$ atoms/cm$^2$ or less.

Further, the cluster ion irradiation step more preferably performed under the conditions of acceleration voltage: 40 keV/atom or less, cluster size: 60 or less, and carbon dose: $5 \times 10^{15}$ atoms/cm$^2$ or less.

Next, a semiconductor epitaxial wafer of the present invention includes a silicon wafer including COPs; a modifying layer formed from a certain element in a surface portion of the silicon wafer; and an epitaxial layer on the modifying layer, wherein the full width half maximum of a concentration profile of the certain element in the depth direction of the modifying layer is 100 nm or less.

Here, the maximum size of the COPs is preferably 0.25 μm or less.

Further, the peak of the concentration profile in the modifying layer preferably lies at a depth within 150 nm from the surface of the silicon wafer, whereas the peak concentration of the concentration profile of the modifying layer is preferably $1 \times 10^{15}$ atoms/cm$^3$ or more.

Moreover, the certain element preferably includes carbon. More preferably, the certain element includes at least two kinds of elements including carbon.

In a method of producing a solid-state image sensing device, according to the present invention, a solid-state image sensing device is formed on the epitaxial layer, located in the surface portion of an epitaxial silicon wafer fabricated by any one of the above producing methods or of any one of the above epitaxial silicon wafers.

Advantageous Effect of Invention

According to the method of producing an epitaxial silicon wafer, of the present invention, a silicon wafer including COPs is irradiated with cluster ions thereby forming a modifying layer formed from a constituent element of the cluster ions in a surface portion of the silicon wafer. This modifying layer can achieve higher gettering capability; thus, an epitaxial silicon wafer which can suppress metal contamination can be efficiently produced.

BRIEF DESCRIPTION OF DRAWINGS

FIGS. 7A and 7B are graphs for comparing the capability of Cu gettering in Invention Example 1 and Comparative Example 1.

DESCRIPTION OF EMBODIMENTS

Figure 1:
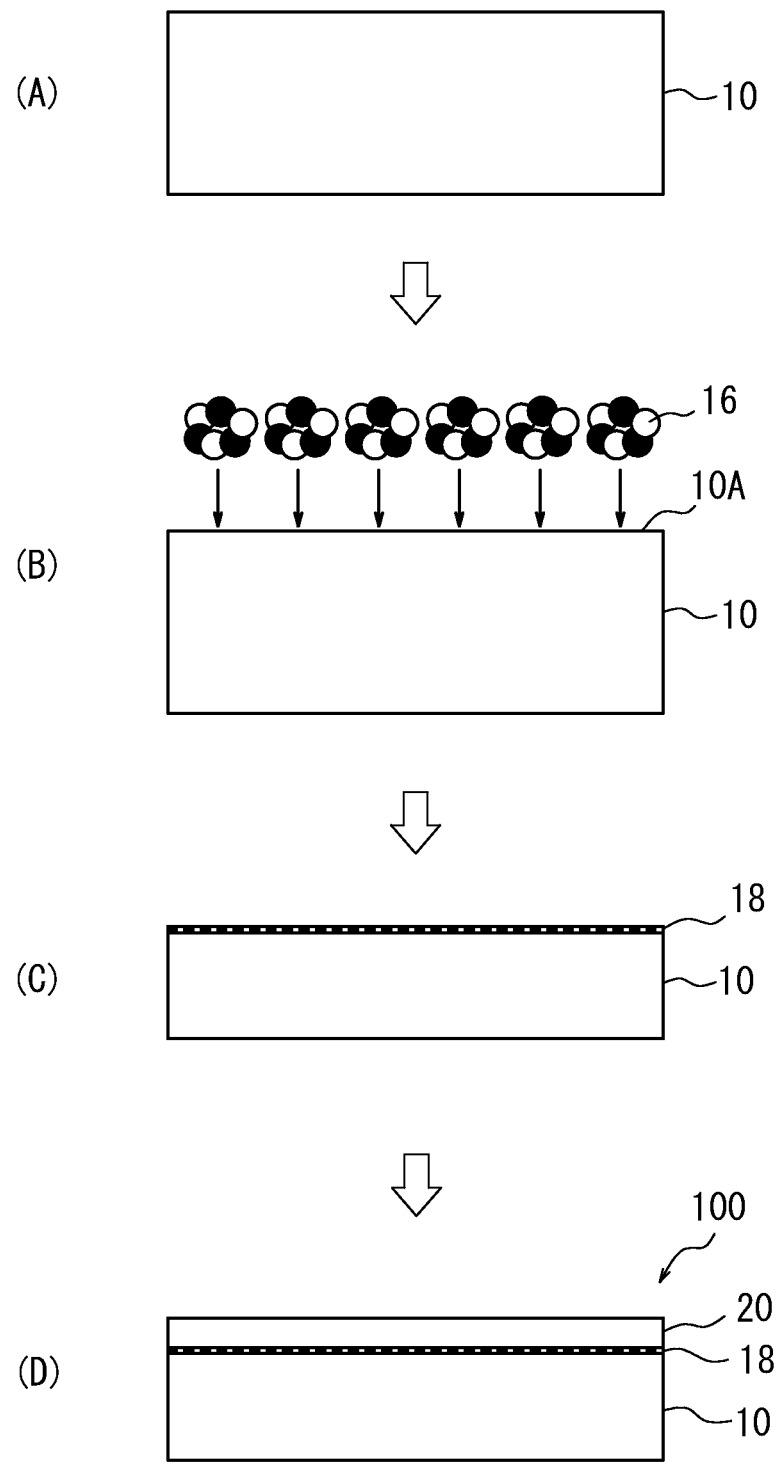
FIGS. 1A to 1D are schematic cross-sectional views illustrating a method of producing an epitaxial silicon wafer 100 of the present invention.

Embodiments of the present invention will be described below in detail with reference to the drawings. In principle, the same components are denoted by the same reference numeral, and the description will not be repeated. In FIG. 1C, an epitaxial layer 20 is exaggerated with respect to a silicon wafer 10 in thickness for the sake of explanation, so the thickness ratio does not conform to the actual ratio.

As shown in FIGS. 1A to 1C, a method of producing an epitaxial silicon wafer 100 according to the present invention includes a wafer production step of pulling a single crystal silicon ingot (not shown) having a COP formation region by Czochralski process (CZ method), and subjecting the obtained single crystal silicon ingot (not shown) to slicing, thereby producing a silicon wafer 10 including COPs (FIG. 1A); a cluster ion irradiation step of irradiating the produced silicon wafer 10 with cluster ions 16 to form a modifying layer 18 formed from a constituent element of the cluster ions 16 in a surface portion 10A of the silicon wafer 10; and an epitaxial layer formation step of forming an epitaxial layer 20 on the modifying layer 18 of the silicon wafer 10. FIG. 1D is a schematic cross-sectional view of the epitaxial silicon wafer 100 obtained by the production method.

First, a silicon wafer 10 including COPs is used as a substrate of the epitaxial silicon wafer 100 in the present invention. A CZ process is employed as a method of producing a single crystal silicon ingot that is a material of the silicon wafer 10. In producing a single crystal silicon ingot using the Czochralski process, a single crystalline silicon melt is supplied into a quartz crucible, the seed crystal is pulled upward while rotating the quartz crucible and the seed crystal, and thus a single crystal silicon ingot is grown downward from the seed crystal.

It is known that various types of grown-in defects occur in thus grown single crystal silicon ingots, which defects affect the device fabrication process. Typical examples of the grown-in defects include dislocation clusters that are formed in a region where interstitial silicon is predominant due to the growth under the condition of low pulling speed (hereinafter also referred to as "I region") and COPs that are formed in a region where vacancies are predominant due to the growth under the condition of high pulling speed (hereinafter referred to as "V region"). Further, in the vicinity of the interface between the I region and the V region, defects are formed in a ring shape, which defects are called oxidation induced stacking faults (OSF).

Figure 2:
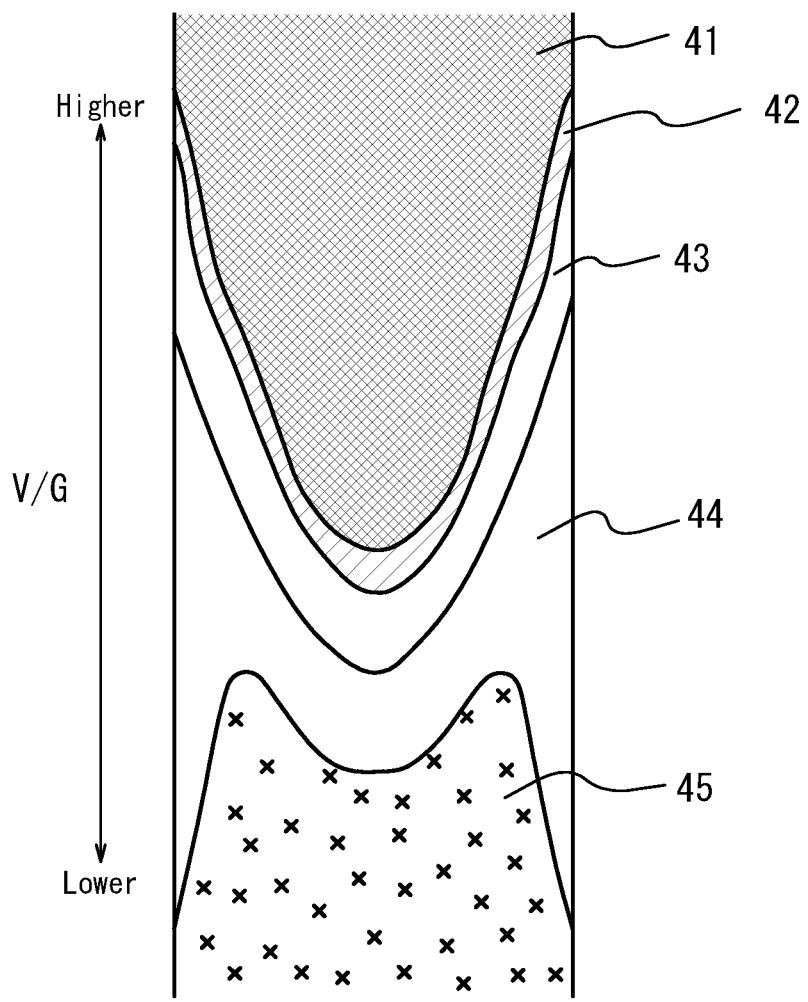
FIG. 2 is a diagram showing the relationship between the ratio of the pulling speed to the temperature gradient at the solid-liquid interface and crystalline regions forming a single crystal silicon ingot.

The distribution of these defects in a grown single crystal silicon ingot is known to depend on two factors, that is, the crystal pulling speed V and the temperature gradient G at the solid-liquid interface. FIG. 2 is a diagram showing the relationship between the ratio of the pulling speed V to the temperature gradient G at the solid-liquid interface (V/G) and crystalline regions forming a single crystal silicon ingot. As shown in the diagram, in the single crystal silicon ingot, a COP formation region 41 which is a crystalline region where COPs are detected is predominant when the V/G is high, whereas an OSF latent nucleus region 42 which appears as a ring-shaped OSF region when performing a certain oxidation heat treatment is formed when the V/G is low. COPs are not detected in this OSF region 42. Further, the silicon wafer collected from the single crystal silicon ingot grown under a condition of high pulling speed, the COP formation region 41 mostly occupies the wafer, so that COPs are formed in almost the entire area in the crystal diameter direction.

With the V/G being lowered, an oxygen precipitation promoted region (hereinafter also referred to as "Pv region") 43, which is a crystalline region where oxygen is present and COPs are not detected is formed; an oxygen precipitation inhibited region (hereinafter also referred to as "Pi region") 44, which is a crystalline region where oxygen is unlikely to precipitate and COPs are not detected is then formed; and a region 45, which is a crystalline region where dislocation clusters are detected, is formed.

For a silicon wafer collected from a single crystal silicon ingot having such a distribution of defects depending on the V/G, the crystalline region other than the COP formation region 41 and the dislocation cluster region 45 is a crystalline region generally regarded as a denuded zone having no defects. The silicon wafer collected from a single crystal silicon ingot including these crystalline regions is a silicon wafer free of dislocation clusters and COPs.

However, growth of a single crystal silicon ingot having the denuded zone is necessarily performed at a lowered ingot pulling speed V, which results in reduced productivity. This being the case, in the present invention, a single crystal silicon ingot having not the denuded zone but the COP formation region 41 is grown, and a silicon wafer including COPs, which is obtained from this ingot, is used as a substrate of the epitaxial silicon wafer 100. In this specification, a "silicon wafer including COPs" means a silicon wafer obtained from a single crystal silicon ingot having the COP formation region 41. In growing a single crystal silicon ingot to be a material of a silicon ingot including COPs, the pulling speed V can be high, which leads to improved productivity and reduced cost.

Note that during the growth of a single crystal silicon ingot having the COP formation region 41, the size and density of the COPs formed in the COP formation region 41 vary due to thermal history of the growing ingot. Here, if the size of COPs is too large, when the epitaxial layer 20 is formed on the silicon wafer 10 obtained from the growing ingot, epitaxial defects caused by COPs, COP marks, and the like would be formed in the epitaxial layer 20.

Figure 3:
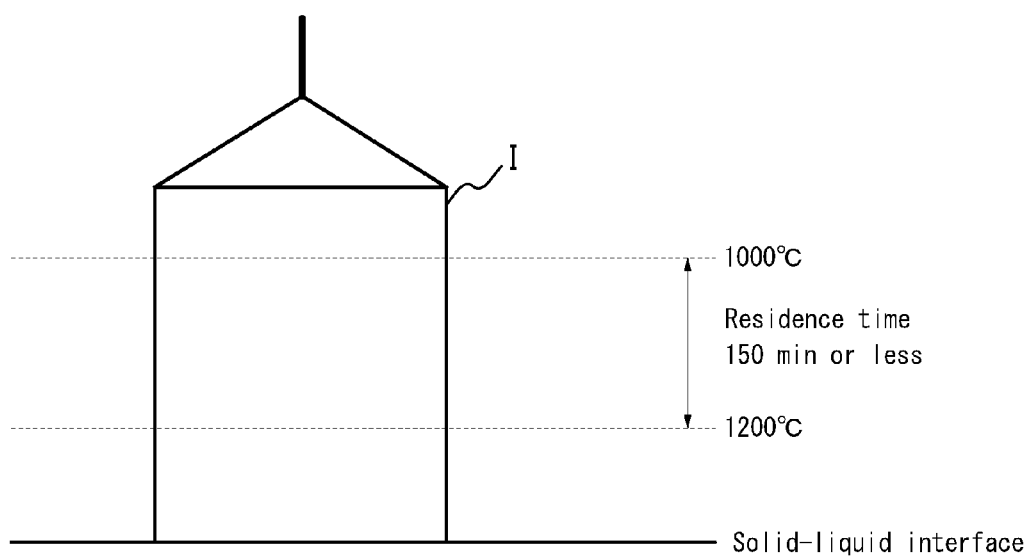
FIG. 3 is a diagram schematically showing pulling of a single crystal silicon ingot.

The inventor of the present invention studied the conditions for suppressing the formation of epitaxial defects to find that the formation of epitaxial defects can be effectively suppressed by pulling the single crystal silicon ingot under growth conditions satisfying the residence time of a single crystal silicon ingot of 150 min or less in a temperature range of 1200° C. to 1000° C. FIG. 3 is a diagram schematically showing pulling of a single crystal silicon ingot. The temperature range of 1200° C. to 1000° C. is a temperature range where COPs are formed, and shorter the residence time of the single crystal silicon ingot I in the temperature range of 1200° C. to 1000° C. (hereinafter also referred to as "COP formation temperature range"), smaller the size of the COPs is. The inventor found that when the residence time of the ingot I in the above temperature range is 150 or less, the maximum size of the COPs formed in the ingot I is 0.25 μm, and formation of epitaxial defects can be suppressed.

The residence time of the ingot I in the above temperature range can be adjusted by controlling the pulling speed in pulling the growing ingot I upward. Since the distribution of crystalline regions formed in the ingot I (defect distribution) varies depending on the ambient temperature in a furnace of a single crystal pulling apparatus used, the pulling speed may be set to a range where the COP formation region can be obtained.

Further, the residence time of the single crystal silicon ingot I in the above COP formation temperature range can be reduced further by increasing the rate of cooling the ingot I. The increase in the cooling rate can be realized specifically by pulling the single crystal silicon ingot I while forcibly cooling around the ingot I. Here, the ingot I can be cooled by placing a cooling member such as a water-cooling member to surround the ingot I. Thus, the residence time of the ingot I in the above temperature range can be shortened more, thereby further improving the productivity.

The polarity of the thus prepared silicon wafer 10 may be n-type or p-type. In addition to the irradiation with cluster ions described below, a silicon wafer having a crystal into which carbon and/or nitrogen are added may be used to further increase gettering capability.

Next, the technical meaning of employing the step of cluster ion irradiation, which is a characteristic step of the present invention, will be described with its operation and effect. The modifying layer 18 formed as a result of irradiation with the cluster ions 16 is a region where the constituent element of the cluster ions 16 is localized at crystal interstitial positions or substitution positions in the crystal lattice of the surface portion 10A of the silicon wafer 10, which region functions as a gettering site. The reason may be as follows. After irradiation in the form of cluster ions, elements such as carbon and boron are localized at high density at substitution positions and interstitial positions in the single crystal silicon. It has been experimentally found that when carbon or boron is turned into a solid solution to the equilibrium concentration of single crystal silicon or higher, the solid solubility of heavy metals (saturation solubility of transition metal) extremely increases. It is considered that carbon or boron made into a solid solution to the equilibrium concentration or higher increases the solubility of heavy metals, which results in significantly increased rate of trapping the heavy metals.

Here, since irradiation with the cluster ions 16 is performed in the present invention, higher gettering capability can be achieved as compared to cases of implanting monomer ions. Moreover, recovery heat treatment can be omitted. Therefore, the epitaxial silicon wafer 100 achieving higher gettering capability can be more efficiently produced, and white spot defects are expected to be reduced more than conventional in back-illuminated solid-state image sensing devices produced from the epitaxial silicon wafer 100 obtained by the producing methods. Note that "cluster ions" herein mean clusters formed by aggregation of a plurality of atoms or molecules, which are ionized by being positively or negatively charged. A cluster is a bulk aggregate having a plurality (typically about 2 to 2000) of atoms or molecules bound together.

The inventor of the present invention considers the operation achieving such an effect as follows.

Figure 4:
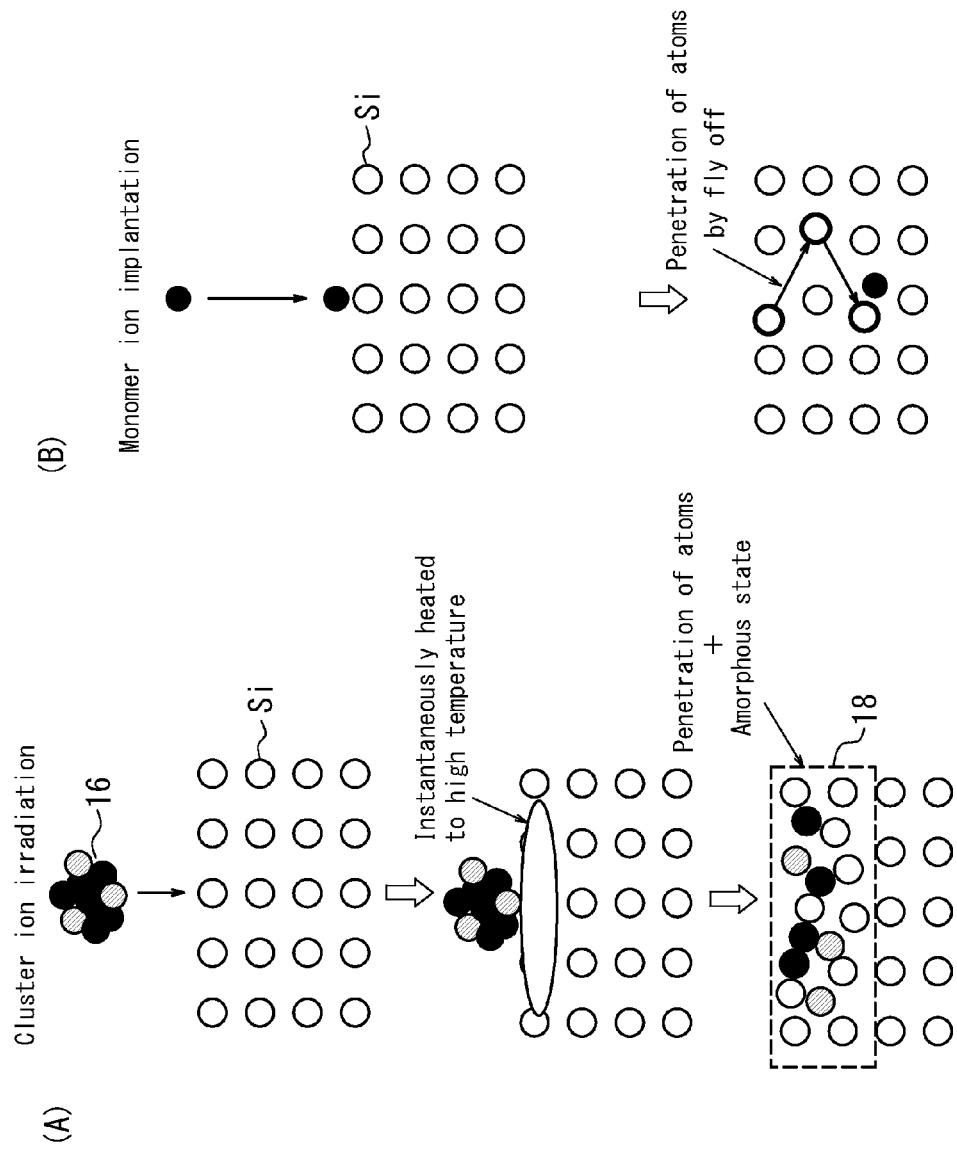
FIG. 4A is a schematic view illustrating an irradiation mechanism of the irradiation with cluster ions.
FIG. 4B is a schematic view illustrating an implantation mechanism of the implantation of monomer ions.

For example, when carbon monomer ions are implanted into a silicon wafer, the monomer ions sputter silicon atoms forming the silicon wafer to be implanted to a predetermined depth position in the silicon wafer, as shown in FIG. 4B. The implantation depth depends on the kind of the constituent element of the implantation ions and the acceleration voltage of the ions. In this case, the concentration profile of carbon in the depth direction of the silicon wafer is relatively broad, and the carbon implanted region extends approximately 0.5 μm to 1 μm. When a plurality of species of ions are simultaneously implanted at the same energy, lighter elements are implanted more deeply, in other words, elements are implanted at different positions depending on their masses. Accordingly, the concentration profile of the implanted elements is broader in such a case.

Monomer ions are typically implanted at an acceleration voltage of about 150 keV to 2000 keV. However, the ions collide with silicon atoms with the energy, which results in disrupted crystallinity of the surface portion of the silicon wafer, to which the monomer ions are implanted. Accordingly, the crystallinity of an epitaxial layer to be grown later on the wafer surface is disrupted. Further, the higher the acceleration voltage is, the more the crystallinity is disrupted. Therefore, it is required to perform heat treatment for recovering the crystallinity having been disrupted at a high temperature for a long time after ion implantation (recovery heat treatment).

On the other hand, when cluster ions 16 formed from, for example, a silicon wafer is irradiated with carbon and boron as shown in FIG. 4A, the cluster ions 16 are instantaneously turned into a high temperature state of about 1350° C. to 1400° C. due to the irradiation energy, thus melting silicon. After that, the silicon is rapidly cooled to form solid solutions of carbon and boron in the vicinity of the surface of the silicon wafer. Accordingly, a "modifying layer" herein means a layer in which the constituent element of the ions used for irradiation forms a solid solution at crystal interstitial positions or substitution positions in the crystal lattice of the surface portion of the silicon wafer. The concentration profile of carbon and boron in the depth direction of the silicon wafer is sharper as compared with the case of monomer ions, although depending on the acceleration voltage and the cluster size of the cluster ions 16. The thickness of the region locally irradiated with carbon and boron (that is, the modification layer) is about 500 nm or less (for example, about 50 nm to 400 nm). After irradiation in the form of cluster ions, the elements are thermally diffused to some extent in the process of forming the epitaxial layer 20. Accordingly, in the concentration profile of carbon and boron after the formation of the epitaxial layer 20, broad diffusion regions are provided on both sides of the peak where these elements are localized. However, the thickness of the modifying layer does not vary greatly (see FIG. 7A described below). Consequently, carbon and boron are precipitated at a high concentration in a localized region. Since the modifying layer 18 is formed in the vicinity of the surface of the silicon wafer, further proximity gettering can be performed. This is considered to result in achievement of still higher gettering capability. The irradiation can be performed simultaneously with a plurality of species of ions in the form of cluster ions In general, irradiation with cluster ions is performed at an acceleration voltage of about 10 keV/Cluster to 100 keV/Cluster. However, since a cluster is an aggregate of a plurality of atoms or molecules, the irradiation with the ions can be performed at reduced energy per one atom or one molecule, which reduces damage to the crystals in the silicon wafer 10. Further, cluster ion irradiation does not disrupt the crystallinity of a silicon wafer 10 as compared with monomer-ion implantation also due to the above described implantation mechanism. Accordingly, after the cluster ion irradiation step, without performing recovery heat treatment on the silicon wafer 10, the silicon wafer 10 can be transferred into an epitaxial growth apparatus to be subjected to the epitaxial layer formation step.

The cluster ions 16 may include a variety of clusters depending on the binding mode, and can be generated, for example, by known methods described in the following documents. Methods of generating gas cluster beam are described in (1) JP 09-041138 A and (2) JP 04-354865 A. Methods of generating ion beam are described in (1) Junzo Ishikawa, "Charged particle beam engineering", ISBN 978-4-339-00734-3 CORONA PUBLISHING, (2) The Institution of Electrical Engineers of Japan, "Electron/Ion Beam Engineering", Ohmsha, ISBN 4-88686-217-9, and (3) "Cluster Ion Beam-Basic and Applications", THE NIKKAN KOGYO SHIMBUN, ISBN 4-526-05765-7. In general, a Nielsen ion source or a Kaufman ion source is used for generating positively charged cluster ions, whereas a high current negative ion source using volume production is used for generating negatively charged cluster ions.

The conditions for irradiation with cluster ions 16 will be described below. First, examples of the element used for irradiation include, but not limited to, carbon, boron, phosphorus, and arsenic. In terms of achieving higher gettering capability, the cluster ions 16 preferably contain carbon as a constituent element. Carbon atoms at a lattice site have a smaller covalent radius than a single crystal silicon ingot, so that a compression site is produced in the silicon crystal lattice, which results in high gettering capability for attracting impurities in the lattice.

Further, the cluster ions preferably contain at least two kinds of elements including carbon as constituent elements. Since the kinds of metals to be efficiently gettered depend on the kinds of the precipitated elements, solid solutions of two or more kinds of elements can cover a wider variety of metal contaminations. For example, carbon can efficiently getter nickel, copper, and the like, whereas boron can efficiently getter copper and iron.

The compounds to be ionized are not limited in particular, but examples of compounds to be suitably ionized include ethane, methane, propane, dibenzyl ($C_{14}H_{14}$), and carbon dioxide ($CO_2$) as carbon sources, and diborane and decaborane ($B_{10}H_{14}$) gas as boron sources. For example, when a mixed gas of dibenzyl and decaborane is used as a material gas, a hydrogen compound cluster in which carbon, boron, and hydrogen are aggregated can be produced. Alternatively, when cyclohexane ($C_6H_{12}$) is used as a material gas, cluster ions 16 formed from carbon and hydrogen can be produced. Further, as a carbon source compound, clusters $C_nH_m$ ($3 \leq n \leq 16$, $3 \leq m \leq 10$) generated from pyrene ($C_{16}H_{10}$), dibenzyl ($C_{14}H_{14}$), or the like is preferably used in particular. This facilitates the formation of small-sized cluster ions having a small diameter.

Next, the acceleration voltage and the cluster size of the cluster ions 16 are controlled, thereby controlling the peak position of the concentration profile of the constituent elements in the depth direction of the modifying layer 18. "Cluster size" herein means the number of atoms or molecules constituting one cluster.

In the cluster ion step of the present invention, in terms of achieving higher gettering capability, the irradiation with the cluster ions 16 is preferably performed such that the peak of the concentration profile of the constituent elements in the depth direction of the modifying layer 18 lies at a depth within 150 nm from the surface portion 10A of the silicon wafer 10. Note that in this specification, "the concentration profile of the constituent elements in the depth direction" in the case where the constituent elements include at least two kinds of elements, means the profiles with respect to the respective single element but not with respect to the total thereof.

For a condition required to set the peak positions to the depth level, when $C_nH_m$ ($3 \leq n \leq 16$, $3 \leq m \leq 10$) is used for the cluster ions 16, the acceleration voltage per one carbon atom is higher than 0 keV/atom and 50 keV/atom or lower, preferably 40 keV/atom or lower. Further, the cluster size is 2 to 100, preferably 60 or less, more preferably 50 or less.

In addition, for adjusting the acceleration voltage, two methods of (1) electrostatic field acceleration and (2) oscillating field acceleration are commonly used. The former method includes a method in which a plurality of electrodes are arranged at regular intervals, and the same voltage is applied therebetween, thereby forming constant acceleration fields in the direction of the axes. The latter method includes a linear acceleration (linac) method in which ions are transferred along a straight line and accelerated with high-frequency waves. The cluster size can be adjusted by controlling the pressure of gas ejected from a nozzle, the pressure of vacuum vessel, the voltage applied to the filament in the ionization, and the like. The cluster size is determined by finding the cluster number distribution by mass spectrometry using the oscillating quadrupole field or by time-of-flight mass spectrometry, and finding the mean value of the cluster numbers.

The cluster dose can be adjusted by controlling the ion irradiation time. In the present invention, the dose of carbon is $1 \times 10^{13}$ atoms/cm$^2$ or more and $1 \times 10^{16}$ atoms/cm$^2$ or less. A dose of less than $1 \times 10^{13}$ atoms/cm$^2$ would lead to insufficient gettering capability, whereas a dose exceeding $1 \times 10^{16}$ atoms/cm$^2$ would cause great damage to the epitaxial surface. The cluster dose is preferably $1 \times 10^{14}$ atoms/cm$^2$ or more and $5 \times 10^{15}$ atoms/cm$^2$ or less.

According to the present invention, as described above, it is not required to perform recovery heat treatment using a rapid heating/cooling apparatus or the like separate from the epitaxial apparatus, such as an RTA or an RTO. This is because the crystallinity of the silicon wafer 10 can be sufficiently recovered by hydrogen baking performed prior to epitaxial growth in an epitaxial apparatus for forming the epitaxial layer 20 to be described below. For typical conditions for hydrogen baking, the epitaxial growth apparatus has a hydrogen atmosphere inside and the silicon wafer 10 is introduced into the furnace at a furnace temperature of 600° C. to 900° C. and it is heated to a temperature in the range of about 1100° C. to 1200° C. at a rate of 1° C./s to 15° C./s, and the temperature is kept for 30 s to 1 min. This hydrogen baking is conventionally performed for removing a natural oxide film formed on a wafer surface due to the cleaning prior to the growth of the epitaxial layer. However, hydrogen baking under the above conditions can sufficiently recover the crystallinity of the silicon wafer 10.

Needless to say, the recovery heat treatment may be performed using a heating apparatus separate from the epitaxial apparatus after the cluster ion irradiation step prior to the epitaxial layer formation step. This recovery heat treatment may be performed at 900° C. to 1200° C. for 10 s to 1 h. Here, the baking temperature is 900° C. to 1200° C. At a temperature lower than 900° C., it is difficult to achieve the effect of recovering the crystallinity, whereas at a temperature of higher than 1200° C., slips would occur due to the high temperature heat treatment, which increases the heat load on the apparatus. Further, the heat processing time is 10 s to 1 h or less. It is difficult to achieve the effect of recovery in cases of less than 10 s, whereas the productivity is deteriorated in cases of more than 1 h, which increases the heat load on the apparatus.

Such recovery heat treatment can be performed using, for example, a rapid heating/cooling apparatus such as an RTA or an RTO, or a batch heating apparatus (vertical heating apparatus, horizontal heating apparatus). The former apparatus is not suitable for long-time treatment, since it performs heating by lamp illumination, and is suitable for heat treatment for within 15 min. On the other hand, the latter can be used for simultaneously heating a multiplicity of wafers at a time, although it takes a long time to raise the temperature to a predetermined temperature. Further, the latter performs resistance heating, which allows for long-time heat treatment. The heating apparatus to be used may be selected as appropriate in consideration of the conditions for irradiation with the cluster ions 16.

A silicon epitaxial layer can be given as an example of the epitaxial layer 20 formed on the modifying layer 18, and the silicon epitaxial layer can be formed under typical conditions. For example, a source gas such as dichlorosilane or trichlorosilane can be introduced into a chamber using hydrogen as a carrier gas, so that the source material can be epitaxially grown on the silicon wafer 10 by CVD at a temperature in the range of about 1000° C. to 1200° C., although the growth temperature varies depending on the source gas to be used. The thickness of the epitaxial layer 20 is preferably in the range of 1 μm to 15 μm. When the thickness is less than 1 μm, the resistivity of the epitaxial layer 20 would change due to outdiffusion of dopants from the silicon wafer 10, whereas a thickness exceeding 15 μm would affect the spectral sensitivity characteristics of the solid-state image sensing device. The epitaxial layer 20 is used as a device layer for producing a back-illuminated solid-state image sensing device.

Next, a silicon wafer 100 produced according to the above methods will be described. As shown in FIG. 1D, this epitaxial silicon wafer 100 includes a silicon wafer 10; a modifying layer 18 formed from a certain element contained as a solid solution in the silicon wafer 10, in a surface portion of the silicon wafer 10; and an epitaxial layer 20 on the modifying layer 18. Here, the silicon wafer 10 is a silicon wafer including COPs, and the full width half maximum of the concentration profile of the certain element in the depth direction of the modifying layer 18 is 100 nm or less. Specifically, according to the method of producing an epitaxial wafer, of the present invention, the element constituting cluster ions can be precipitated at a high concentration in a localized region as compared with monomer-ion implantation, which results in the full width half maximum of 100 nm or less. The lower limit of the full width half maximum can be set to 10 nm.

Note that "concentration profile in the depth direction" herein means a concentration distribution in the depth direction, which is measured by secondary ion mass spectrometry (SIMS). Meanwhile, "full width half maximum of the concentration profile of a certain element in the depth direction" means a full width half maximum of the concentration profile of a certain element in an epitaxial layer measured by SIMS and if the thickness of the epitaxial layer exceeds 1 μm, the epitaxial layer is previously thinned to 1 μm considering the measurement precision.

Here, the maximum size of the COPs included in the silicon wafer 10 is preferably 0.25 μm or less. Thus, an epitaxial silicon wafer 100 with less (reduced) epitaxial defects can be obtained. Note that the size of COPs in this specification means a size measured using an optical precipitate profiler (OPP) manufactured by Accent Optical Technologies Co., Ltd.

The certain element is not limited in particular as long as it is an element other than silicon. However, carbon or at least two kinds of elements containing carbon are preferable as described above.

In terms of achieving higher gettering capability, it is preferable that the peak of the concentration profile of the constituent element in the depth direction of the modifying layer 18 lies at a depth within 150 nm from the surface of the silicon wafer 10 in the epitaxial silicon wafer 100. Further, the peak concentration of the concentration profile is preferably $1 \times 10^{15}$ atoms/cm$^3$ or more, more preferably in the range of $1 \times 10^{17}$ atoms/cm$^3$ to $1 \times 10^{22}$ atoms/cm$^3$, and still more preferably in the range of $1 \times 10^{19}$ atoms/cm$^3$ to $1 \times 10^{21}$ atoms/cm$^3$.

The thickness of the modifying layer 18 in the thickness direction may be approximately in the range of 30 nm to 400 nm.

The metal contamination of the epitaxial silicon wafer 100 of the present invention can be further suppressed by achieving higher gettering capability than conventional.

For a method of producing a solid-state image sensing device according to an embodiment of the present invention, a solid-state image sensing device is formed on the epitaxial layer 20, located in the surface portion of the epitaxial wafer fabricated by any one of the above producing methods or of any one of the above epitaxial silicon wafers, that is, the epitaxial silicon wafer 100. In solid-state image sensing devices obtained by this producing method, formation of white spot defects can be sufficiently suppressed than conventional.

Representative embodiments of the present invention have been described above. However, the present invention is not limited to those embodiments. For example, two epitaxial layers may be formed on the silicon wafer 10.

EXAMPLES

First, single crystal silicon ingots were grown with varied residence time in a temperature range of 1200° C. to 1000° C. (COP formation temperature range). Specifically, single crystal silicon ingots (a) to (d) having four levels of COP formation regions, in which the residence time of the ingots in the COP formation temperature range varies, were grown using three levels of single crystal pulling apparatuses having different hot zone structures at a pulling speed adjusted such that the single crystal silicon ingots to be grown dwell in the temperature range of 1200° C. to 1000° C. for (a) 50 min, (b) 80 min, (c) 150 min, and (d) 160 min.

Figure 5:
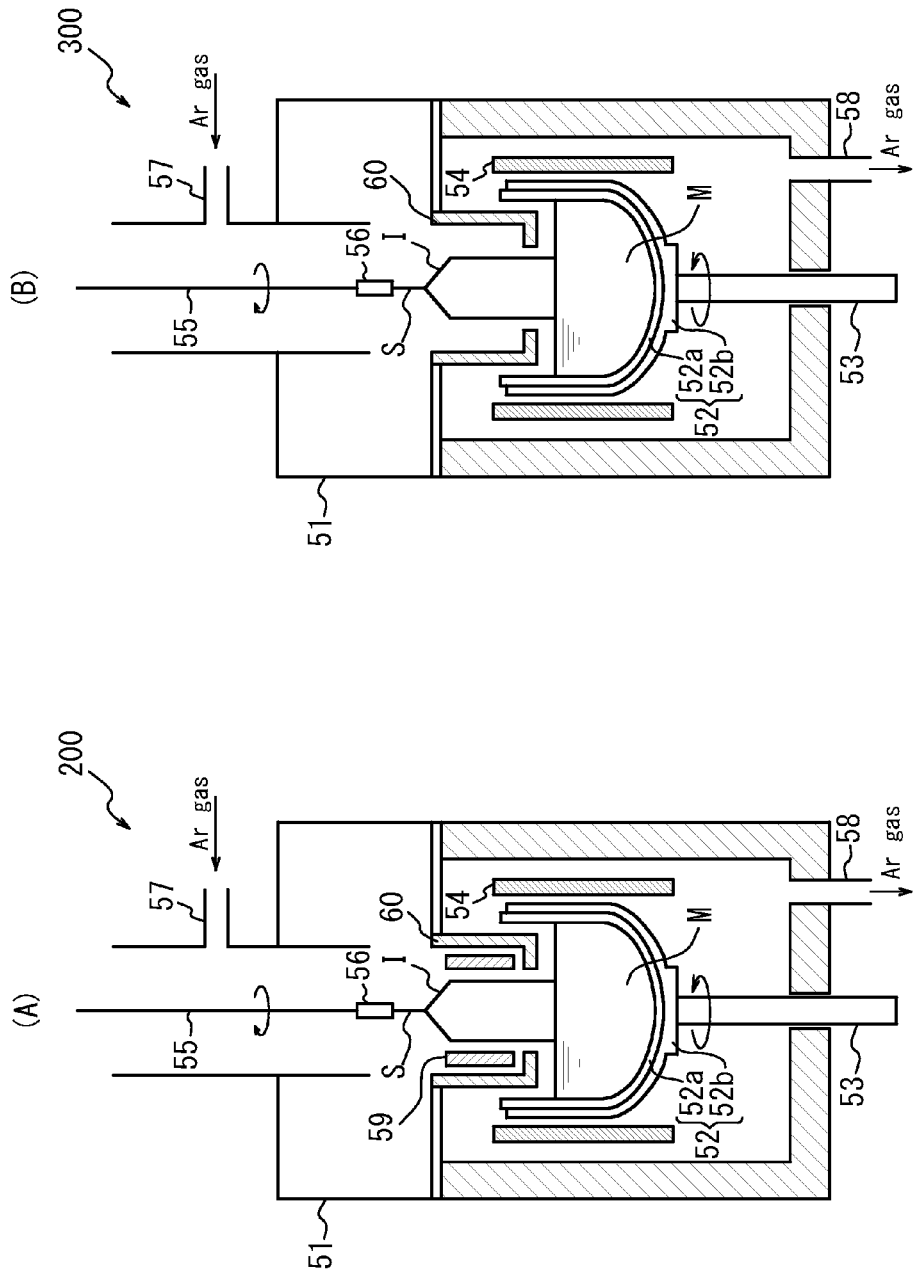
FIGS. 5A and 5B are diagrams showing single crystal pulling apparatuses used in Examples.

Single crystal pulling apparatuses used for growing the above four levels of single crystal silicon ingots (a) to (d) are shown in FIGS. 5A and 5B. A single crystal pulling apparatus 200 shown in FIG. 5A includes, in a chamber 51, a crucible 52 composed of a quartz crucible 52a and a graphite crucible 52b for receiving polycrystalline silicon that is a source material of a single crystal silicon ingot I and carbon; a crucible rotating/elevating shaft 53 provided under the crucible 52, for rotating the crucible 52 in the circumferential direction and vertically elevating the crucible 52; a heater 54 for melting the source material in the crucible 52 to form a material melt M; a seed crystal holder 56 attached to a tip of a lifting shaft 55, for holding a seed crystal S; a gas inlet 57 for introducing an inert gas into the chamber 51 while growing the ingot I; an exhaust port 58 for evacuating the inert gas supplied into the chamber 51; a cylindrical heat shield 60 placed to surround the growing ingot I; and a cooling member (water-cooling material) 59 placed inside the heat shield 60 to surround the growing ingot I. The heat shield 60 shields the growing ingot I against high temperature radiant heat from the material melt M in the crucible 52 and the side walls of the heater 54 and the crucible 52, thereby adjusting the amount of incident light and the amount of heat diffused in the vicinity of the crystal growth interface. The cooling member 59 forcibly cools the growing single crystal ingot.

A single crystal pulling apparatus 300 shown in FIG. 5B is the same as the apparatus 200 except for not having the cooling member 59 in the apparatus 200.

In addition, for the ingot (c), a single crystal pulling apparatus 400 (not shown) was used, which can grow an ingot I with the temperature gradient between the center part and of the edge part of the growing single crystal ingot (at its melting point to 1370° C.) being reduced by increasing the gap between the lower end of the heat shield 60 and the material melt M in the apparatus 300.

A method of growing a single crystal silicon ingot I is described taking a case of using the above apparatus 200, for example. First, a solid material such as polycrystalline silicon filling the inside of the crucible 52 is melted by heating with the heater 54, with the chamber 51 being kept in an Ar gas atmosphere under reduced pressure, thereby forming the material melt M. After that, the lifting shaft 55 is lowered to immerse the seed crystal S in the material melt M, and raising the lifting shaft 55 upward while rotating the crucible 52 and the lifting shaft 55 in a certain direction, thereby growing the ingot I downward from the seed crystal S. Further, the ingot I is pulled while cooling around the growing ingot I with the cooling member 59. When the apparatuses 300 and 400 are used, an ingot I is not cooled. Ingot growth conditions will now be described.

First, the ingot (a) was grown using the single crystal pulling apparatus 200 shown in FIG. 5A in order to shorten the residence time of the ingot in the temperature range of 1200° C. to 1000° C. On that occasion, the pulling speed was set such that the residence time of the ingot I in the temperature range of 1200° C. to 1000° C. was 50 min.

Meanwhile, the ingot (b) was grown using the single crystal pulling apparatus 300 shown in FIG. 5B. The ingot (b) was grown in the same manner as the ingot (a) except that the pulling speed was set such that the residence time of the ingot I in the temperature range of 1200° C. to 1000° C. was 80 min.

For the ingot (c), a single crystal pulling apparatus 400 (not shown) was used, in which the temperature gradient between the center part and of the edge part of the single crystal ingot immediately after being grown (at its melting point to 1370° C.) was reduced by increasing the gap between the lower end of the heat shield 60 and the material melt M in the apparatus 300 shown in FIG. 5B such that the same crystalline region spreads in the radial direction. The growth conditions of the ingot (c) were the same as those of the ingot (a) except that the pulling speed was set such that the residence time of the ingot I in the temperature range of 1200° C. to 1000° C. was 150 min.

Further, the ingot (d) was also grown using the apparatus 300 shown in FIG. 5B as well as the ingot (b). The growth conditions of the ingot (d) were the same as those of the ingot (a) except that the pulling speed was lower than in the case of growing the ingot (b) such that the residence time of the ingot I in the temperature range of 1200° C. to 1000° C. was 160 min.

The grown ingots (a) to (d) were n-type single crystal silicon ingots having a diameter of 300 mm with a crystal orientation of <100>, where the n-type dopant was phosphorus, and the concentration of phosphorus was in the range of $1\times10^{15}$ atoms/cm$^3$ to $1\times10^{17}$ atoms/cm$^3$. Meanwhile, the oxygen concentration (ASTM F121-1979) was in the range of $12\times10^{17}$ atoms/cm$^3$ to $14\times10^{17}$ atoms/cm$^3$.

Next, the grown four levels of single crystal silicon ingots (a) to (d) were subjected to process steps of known peripheral grinding, slicing, lapping, etching, and mirror polishing, thereby preparing silicon wafers (a) to (d) having a thickness of 725 μm.

Invention Examples 1 to 4

Subsequently, $C_5H_5$ clusters were generated as cluster ions using a cluster ion generator (CLARIS produced by Nissin Ion Equipment Co., Ltd.), and the silicon wafers (a) to (d) fabricated as described above were with the cluster ions under the conditions of dose: $1.00\times10^{14}$ Clusters/cm$^2$ (carbon dose: $5.00\times10^{14}$ atoms/cm$^2$), and acceleration voltage per one carbon atom: 14.8 keV/atom. After that, each silicon wafers was transferred into a single wafer processing epitaxial growth apparatus (produced by Applied Materials, Inc.) and subjected to hydrogen baking at 1120° C. for 30 s in the apparatus. A silicon epitaxial layer (thickness: 10 μm, kind of dopant: phosphorus, dopant concentration: $1\times10^{15}$ atoms/cm$^3$) was then epitaxially grown on the silicon wafer by CVD at 1150° C. using hydrogen as a carrier gas and trichlorosilane as a source gas, thereby obtaining an epitaxial silicon wafer of the present invention. Note that in Invention Examples 1 to 4, irradiation with cluster ions was performed at 80 keV/Cluster, and each cluster was composed of five carbon atoms (atomic weight 12) and five hydrogen atoms (atomic weight 1). Accordingly, the energy received by one carbon atom was about 14.8 keV/atom.

Comparative Examples 1 to 4

Epitaxial silicon wafers according to Comparative Examples 1 to 4 were produced in the same manner as in Invention Examples 1 to 3 except that monomer ions of carbon were produced using $CO_2$ as a material gas and a monomer-ion implantation step was performed under the conditions of dose: $1.00\times10^{14}$ atoms/cm$^2$ and acceleration voltage: 300 keV/atom instead of the step of irradiation with cluster ions.

The wafers prepared in Invention Examples and Comparative Examples above were evaluated. The evaluation methods are shown below.

(1) SIMS Measurement

Figure 6:
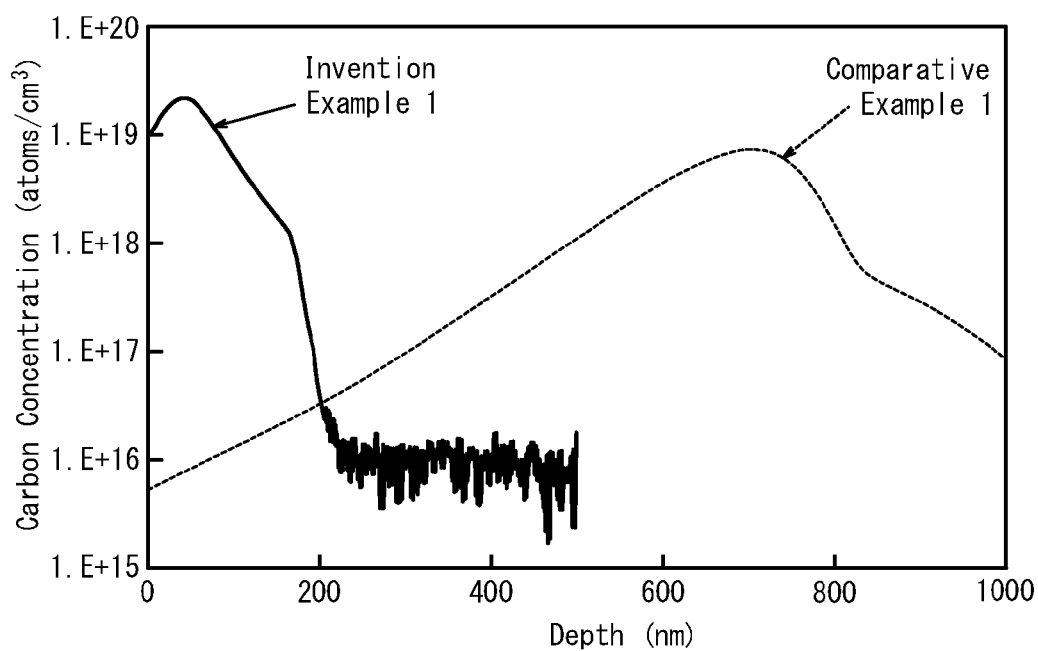
FIG. 6 is a graph showing profiles of carbon concentration with respect to the depth from the surface of a silicon wafer between Invention Example 1 and Comparative Example 1.

In order to explain the difference of carbon distribution between immediately after irradiation with cluster ions and immediately after implantation of monomer ions, first, SIMS measurement was performed on the silicon wafers of Invention Example 1 and Comparative Example 1 before forming the epitaxial layers. The obtained carbon concentration profile is shown in FIG. 6 for reference. Here, the horizontal axis in FIG. 6 corresponds to the depth from the surface of the silicon wafer.

Next, SIMS measurement was performed on the epitaxial silicon wafers of Invention Example 1 and Comparative Example 1. The obtained carbon concentration profiles are shown in FIGS. 7A and 7B. The horizontal axis in each of FIGS. 7A and 7B corresponds to the depth from the surface of the epitaxial silicon wafer.

Further, SIMS measurement was performed on the samples prepared in Invention Examples and Comparative Examples after reducing the thickness of the epitaxial layers to 1 μm. The full width half maximums of the measured carbon concentration profiles are shown in Table 1. Note that as described above, the full width half maximums shown in Table 1 are ones measured by SIMS measurement after reducing the thickness of the epitaxial layers to 1 μm, so that the full width half maximums shown in Table 1 are different from those shown in FIGS. 7A and 7B. Further, the peak position of the concentration and the peak concentration at the time of the SIMS measurement on each sample with the thinned epitaxial wafer are also shown in Table 1.

TABLE 1

| | Wafer crystalline region | Residence time in COP formation temperature range (min) | Maximum COP size (μm) | Cluster ion irradiation conditions (Invention Example) | | | Evaluation result | | | | |
|---|---|---|---|---|---|---|---|---|---|---|---|
| | | | | | Monomer-ion implantation conditions (Comparative Example) | | SIMS measurement result | | | | |
| | | | | Irradiation/implantation ions | Acceleration voltage (keV/atom) | Dose (Clusters/cm$^2$) (atoms/cm$^2$) | Carbon concentration peak position (nm) | Carbon peak concentration (atoms/cm$^3$) | Half width (nm) | Gettering capability evaluation | Stacking faults (number/wafer) |
| Invention Example 1 | (a) | 50 | 0.18 | $C_5H_5$ | 14.8 | $1.00\times10^{14}$ | 51 | $1.42\times10^{19}$ | 89 | A | 2 |
| Invention Example 2 | (b) | 80 | 0.24 | $C_5H_5$ | 14.8 | $1.00\times10^{14}$ | 50 | $1.45\times10^{19}$ | 89 | A | 4 |
| Invention | (c) | 150 | 0.23 | $C_5H_5$ | 14.8 | $1.00\times10^{14}$ | 52 | $1.45\times10^{19}$ | 90 | A | 4 |

TABLE 1-continued

| | | Residence time | Cluster ion irradiation conditions (Invention Example) | | | Evaluation result | | | | |
| | | | | Monomer-ion implantation conditions (Comparative Example) | | | SIMS measurement result | | | |
| Wafer | | in COP formation temper- | Maxi-mum | | | | Carbon concen-tration | Carbon peak | | Stacking |
| crystal-line region | | ature range (min) | COP size (μm) | Irradiation/ implantation ions | Acceleration voltage (keV/atom) | Dose (Clusters/cm²) (atoms/cm²) | peak position (nm) | concen-tration (atoms/cm³) | Half width (nm) | Gettering capability evaluation | faults (number/ wafer) |
| Example 3 | | | | | | | | | | | |
| Invention Example 4 | (d) | 160 | 0.33 | $C_5H_5$ | 14.8 | $1.00 \times 10^{14}$ | 50 | $1.44 \times 10^{19}$ | 90 | A | 9 |
| Comparative Example 1 | (a) | 50 | 0.18 | C | 300 | $1.00 \times 10^{14}$ | 695 | $7.14 \times 10^{18}$ | 190 | C | 2 |
| Comparative Example 2 | (b) | 80 | 0.24 | C | 300 | $1.00 \times 10^{14}$ | 699 | $7.12 \times 10^{18}$ | 193 | C | 4 |
| Comparative Example 3 | (c) | 150 | 0.23 | C | 300 | $1.00 \times 10^{14}$ | 697 | $7.14 \times 10^{18}$ | 193 | C | 4 |
| Comparative Example 4 | (d) | 160 | 0.33 | C | 300 | $1.00 \times 10^{14}$ | 695 | $7.13 \times 10^{18}$ | 192 | C | 9 |

(2) Evaluation of Gettering Capability

The silicon wafer surface of each sample fabricated in Invention Examples and Comparative Examples was contaminated on purpose by a spin coat contamination method using Cu contaminant liquid ($1.0 \times 10^{12}$ atoms/cm²) and was then subjected to heat treatment at 900° C. for 30 min. After that, a SIMS measurement was performed. The Cu concentration profiles and the carbon concentration profiles of Invention Example 1 and Comparative Example 1 are shown as representative measurement results (FIGS. 7A and 7B). Results of gettering capability evaluation with respect to other invention examples and comparative examples are shown in Table 1. Note that the criteria were classified as follows depending on the value of the peak concentration of the Cu concentration profile.

A (Excellent): $1.0 \times 10^{17}$ atoms/cm³ or more
B (Good): $7.5 \times 10^{16}$ atoms/cm³ or more and less than $1.0 \times 10^{17}$ atoms/cm³
C (Fair): Less than $7.5 \times 10^{16}$ atoms/cm³

Figure 8:
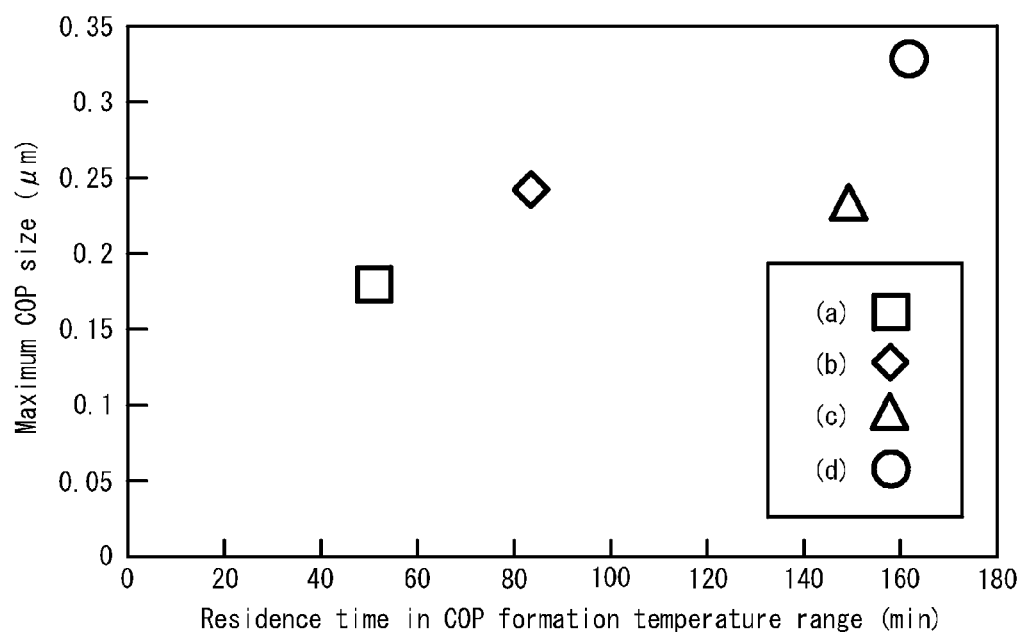
FIG. 8 is a graph showing the relationship between the residence time in COP formation temperature range and the maximum size of COPs.
Figure 9:
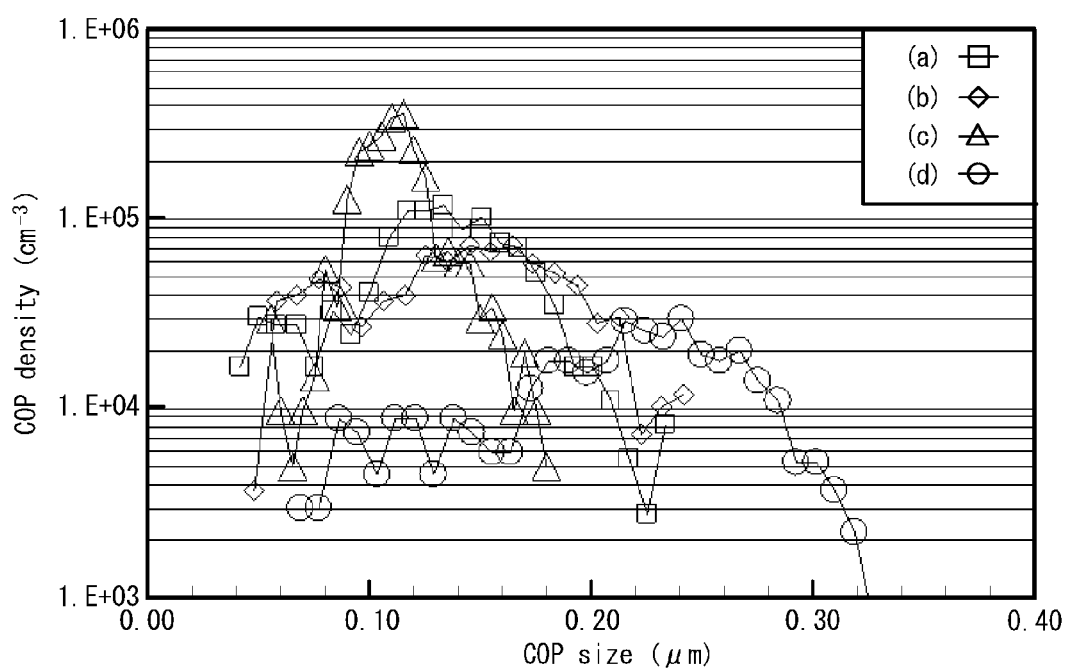
FIG. 9 shows a graph showing the relationship between the COP size and the COP density.

(3) Relationship Between the Residence Time in COP Formation Temperature Range and COP Size Single crystal silicon ingots in a growing process were examined with respect to change in the distributions of size and density of COPs formed in the ingots depending on the residence time of the single crystal silicon ingots in the temperature range of 1200° C. to 1000° C. (COP formation temperature range). Specifically, the silicon wafers (a) to (d) cut out of the single crystal silicon ingots which have not been irradiated with cluster ions were subjected to SC-1 cleaning (a cleaning using a mixed solution of ammonium hydroxide: hydrogen peroxide solution:ultrapure water=1:1:15). After that, the wafers cleaned by SC-1 were evaluated with respect to the size and density of COPs by infrared laser bright-field interferometry using an OPP manufactured by Accent Optical Technologies Co., Ltd. The relationship found between the residence time in the COP formation temperature range and the maximum size of COPs is shown in FIG. 8. Meanwhile, the relationship between the COP size and the COP density is shown in FIG. 9.

For each of the silicon wafers (a) to (c), since the residence time of the single crystal silicon ingot in the temperature range of 1200° C. to 1000° C. was short (within 150 min), the maximum size of the observed COPs did not exceed 0.25 μm.

On the other hand, for the silicon wafer (d), the residence time in the temperature range of 1200° C. to 1000° C. was long (beyond 150 min), the maximum size of the COPs was 0.33 μm, which was larger than that of the silicon wafers (a) to (c).

(4) Evaluation of Epitaxial Defects

The surface of the epitaxial silicon wafer of each of the samples fabricated in invention Examples and Comparative Examples was observed and evaluated using Surfscan SP2 manufactured by KLA-Tencor Corporation to examine the formation of LPDs. The observation was performed using an observation mode of oblique mode (oblique incidence mode), and the surface pits were examined based on the ratio of the sizes measured using Wide/Narrow channels. Subsequently, whether the LPDs were stacking faults (SFs) or not was evaluated using a scanning electron microscope (SEM) by observing and evaluating the area where the LPDs are formed. After that, samples for observing and evaluating cross sections including the SF formation area were fabricated by focused ion beam (FIB) processing. Finally, these evaluation samples were observed and evaluated using a transmission electron microscope (TEM), thereby evaluating whether the LPDs were SFs caused by COPs or not. The number of SFs is shown in Table 1.

First, Invention Example 1 is compared with Comparative Example 1 which is different only in that monomer ion implantation was performed instead of irradiation with cluster ions. As shown in FIG. 6, comparing the carbon concentration profiles of silicon wafers before forming an epitaxial layer, which silicon wafers are in-process products, between immediately after irradiation with cluster ions and immediately after monomer-ion implantation, the carbon concentration after the irradiation with cluster ions is sharp, whereas the carbon concentration profile after monomer-ion implantation is broad. This suggests that the tendency of the carbon concentration profile remains the same even after forming the epitaxial layer. Actually, as evident from the carbon concentration profiles of these in-process products provided with an epitaxial layer (FIGS. 7A and 7B), the irradiation with cluster ions yielded a modifying layer more locally at a higher concentration than in monomer-ion implantation. Further, comparing Invention Example 1 and Comparative Example 1 based on the Cu concentration profiles shown in FIGS. 7A and 7B, the modifying layer of Invention Example 1 formed by cluster ion irradiation is found to have captured a large amount of Cu, thus achieving high gettering capability.

Moreover, as shown in Table 1, in each of Invention Examples 1 to 4 in which irradiation with cluster ions was performed, the full width half maximum was 100 nm or less, and sufficient gettering capability was achieved. On the other hand, in Comparative Examples 1 to 4 in which monomer-ion implantation was performed, the full width half maximum exceeded 100 nm, so that poor gettering capability was achieved. Thus, in Invention Examples 1 to 4, in which irradiation with cluster ions was performed, higher gettering capability can be achieved due to smaller full width half maximum of the carbon concentration profile than in Comparative Examples 1 to 4 in which monomer-ion implantation was performed.

Moreover, with respect to SFs formed in the epitaxial layer in the silicon wafers (a) to (d), the number of SFs was 10 or less per each wafer, which was favorable. It was found, in particular, when the silicon wafers (a) to (c) obtained from the single crystal ingots grown with the shortened residence time in the COP formation temperature range were used, epitaxial silicon wafers in each of which the maximum size of COPs was 0.25 μm or less and the number of SFs caused by COPs in the epitaxial layer was small (four or less per wafer) were successfully obtained.

INDUSTRIAL APPLICABILITY

The present invention can provide a method of efficiently producing an epitaxial silicon wafer which can achieve higher gettering capability thereby suppressing metal contamination. Therefore, the present invention is useful in an industry of semiconductor epitaxial wafer production.

REFERENCE NUMERALS

10: Silicon wafer
10A: Surface portion of silicon wafer
16: Cluster ions
18: Modifying layer
20: Epitaxial layer
41: COP formation region
42: OSF latent nucleus region
43: Oxygen precipitation promoted region (Pv region)
44: Oxygen precipitation inhibited region (Pi region)
45: Dislocation cluster region
51: Chamber
52: Crucible
52a: Quartz crucible
52b: Graphite crucible
53: Crucible rotating/elevating shaft
54: Heater
55: Lifting shaft
56: Seed crystal holder
57: Gas inlet
58: Exhaust port
59: Cooling member
60: Heat shield
100: Epitaxial silicon wafer
200, 300: Single crystal pulling apparatuses
I: Single crystal silicon ingot
S: Seed crystal
M: Material melt

The invention claimed is:

1. A method of producing an epitaxial wafer comprising:
a wafer production step of pulling a single crystal silicon ingot having a COP formation region by Czochralski process, and subjecting the obtained single crystal silicon ingot to slicing, thereby producing a silicon wafer including COPs;
a cluster ion irradiation step of irradiating the produced silicon wafer with cluster ions to form a modifying layer formed from a constituent element of the cluster ions in a surface portion of the silicon wafer; and
an epitaxial layer formation step of forming an epitaxial layer on the modifying layer of the silicon wafer.

2. The method of producing an epitaxial silicon wafer, according to claim 1, wherein the single crystal silicon ingot is pulled at growing conditions: residence time of the single crystal silicon ingot for 150 min or less in a temperature range of 1200° C. to 1000° C.

3. The method of producing an epitaxial silicon wafer, according to claim 2, wherein the pulling is performed while cooling around the single crystal silicon ingot.

4. The method of producing an epitaxial silicon wafer, according to claim 1, wherein after the cluster ion irradiation step, the silicon wafer is transferred into an epitaxial growth apparatus to be subjected to the epitaxial layer formation step without heat treating the silicon wafer for recovering its crystallinity.

5. The method of producing an epitaxial silicon wafer, according to claim 1, wherein the cluster ions contain carbon as a constituent element.

6. The method of producing an epitaxial silicon wafer, according to claim 5, wherein the cluster ions contain at least two kinds of elements including carbon as constituent elements.

7. The method of producing an epitaxial silicon wafer, according to claim 1, wherein in the cluster ion irradiation step, the silicon wafer is irradiated with the cluster ions such that the peak of a concentration profile of the constituent element in the depth direction of the modifying layer lies at a depth within 150 nm from the surface of the silicon wafer.

8. The method of producing an epitaxial silicon wafer, according to claim 7, wherein the cluster ion irradiation step is performed under the conditions of acceleration voltage: 50 keV/atom or less, cluster size: 100 or less, and carbon dose: $1 \times 10^{16}$ atoms/cm$^2$ or less.

9. The method of producing an epitaxial silicon wafer, according to claim 7, wherein the cluster ion irradiation step is performed under the conditions of acceleration voltage: 40 keV/atom or less, cluster size: 60 or less, and carbon dose: $5 \times 10^{15}$ atoms/cm$^2$ or less.

10. The method of producing an epitaxial silicon wafer, according to claim 1, wherein in the first step, the silicon wafer is irradiated with the cluster ions such that the full width half maximum of a concentration profile of the constituent element in the depth direction of the modifying layer is 100 nm or less.

11. A method of producing a solid-state image sensing device, wherein a solid-state image sensing device is formed on the epitaxial layer, located in the surface portion of an epitaxial silicon wafer fabricated by the producing method according to claim 1.

12. A method of producing a solid-state image sensing device, wherein a solid-state image sensing device is formed on the epitaxial layer, located in the surface portion of the epitaxial silicon wafer fabricated by the producing method according to claim 1, wherein in the first step, the silicon wafer is irradiated with the cluster ions such that the full width half maximum of a concentration profile of the constituent element in the depth direction of the modifying layer is 100 nm or less.

* * * * *